(12) United States Patent
Thompson et al.

(10) Patent No.: US 9,903,718 B2
(45) Date of Patent: Feb. 27, 2018

(54) MEMS DEVICE MECHANICAL AMPLITUDE CONTROL

(71) Applicant: InvenSense, Inc., San Jose, CA (US)

(72) Inventors: Matthew J. Thompson, Beaverton, OR (US); Ilya Gurin, Mountain View, CA (US)

(73) Assignee: INVENSENSE, INC., San Jose, CA (US)

(*) Notice: Subject to any disclaimer, the term of this patent is extended or adjusted under 35 U.S.C. 154(b) by 120 days.

(21) Appl. No.: 14/723,676

(22) Filed: May 28, 2015

(65) Prior Publication Data

US 2016/0349056 A1 Dec. 1, 2016

(51) Int. Cl.
*G01C 19/5762* (2012.01)
*G01C 19/5755* (2012.01)
*B81B 3/00* (2006.01)

(52) U.S. Cl.
CPC ........ *G01C 19/5755* (2013.01); *B81B 3/0018* (2013.01); *B81B 2201/02* (2013.01)

(58) Field of Classification Search
CPC ........ G01P 2015/0871; G01C 19/5755; G01C 19/5762; B81B 3/0018; B81B 2201/02
See application file for complete search history.

(56) References Cited

U.S. PATENT DOCUMENTS

| | | | | |
|---|---|---|---|---|
| 5,140,155 A * | 8/1992 | Carome | ........... | G01P 15/093 250/227.21 |
| 6,311,556 B1 * | 11/2001 | Lefort | ........... | G01P 1/006 73/514.29 |
| 8,049,326 B2 * | 11/2011 | Najafi | ........... | B81B 7/0058 257/678 |
| 8,151,640 B1 * | 4/2012 | Kubena | ........... | G01C 19/5684 73/503.3 |
| 8,689,631 B1 * | 4/2014 | Tally | ........... | G01C 19/5762 73/504.12 |
| 2003/0115960 A1 * | 6/2003 | Franz | ........... | G01C 19/5755 73/514.29 |
| 2003/0159509 A1 * | 8/2003 | Kim | ........... | B81B 3/0062 73/504.03 |
| 2006/0027019 A1 * | 2/2006 | Ito | ........... | G01C 19/5719 73/504.12 |
| 2006/0107743 A1 * | 5/2006 | Ullmann | ........... | B81B 7/0012 73/514.38 |

(Continued)

FOREIGN PATENT DOCUMENTS

WO   WO 2013188131 A1 * 12/2013 ........... G01P 15/097

*Primary Examiner* — David Bolduc
(74) *Attorney, Agent, or Firm* — Maynard Cooper & Gale, LLP; Joshua V. Van Hoven, Esq.

(57) ABSTRACT

A system and/or method for utilizing mechanical motion limiters to control proof mass amplitude in MEMS devices (e.g., MEMS devices having resonant MEMS structures, for example various implementations of gyroscopes, magnetometers, accelerometers, etc.). As a non-limiting example, amplitude control for a MEMS gyroscope proof mass may be accomplished during normal (e.g., steady state) gyroscope operation utilizing impact stops (e.g., bump stops) of various designs. As another non-limiting example, amplitude control for a MEMS gyroscope proof mass may be accomplished utilizing non-impact limiters (e.g., springs) of various designs, for example springs exhibiting non-linear stiffness characteristics through at least a portion of their normal range of operation.

24 Claims, 9 Drawing Sheets

(56) References Cited

U.S. PATENT DOCUMENTS

| | | | | |
|---|---|---|---|---|
| 2006/0196266 A1* | 9/2006 | Holt | .................... | G01C 19/5719 73/504.02 |
| 2007/0089512 A1* | 4/2007 | Matsuhisa | ............... | G01C 19/56 73/514.16 |
| 2007/0222011 A1* | 9/2007 | Robert | ................ | G01C 19/574 257/415 |
| 2007/0240486 A1* | 10/2007 | Moore | .................... | G01C 21/16 73/1.37 |
| 2008/0121054 A1* | 5/2008 | Goldenberg | ........... | G01C 19/08 74/5.7 |
| 2008/0150554 A1* | 6/2008 | Wang | ................. | G01C 19/5755 324/686 |
| 2008/0178672 A1* | 7/2008 | Kanai | ................ | G01C 19/5649 73/504.12 |
| 2009/0084180 A1* | 4/2009 | Yoshida | ................ | G01F 1/8431 73/504.02 |
| 2010/0006958 A1* | 1/2010 | Krylov | .................. | B81B 3/0021 257/415 |
| 2010/0078740 A1* | 4/2010 | Cazzaniga | ............ | B81B 3/0013 257/415 |
| 2010/0116043 A1* | 5/2010 | Pannek | ............... | B60C 23/0408 73/146.5 |
| 2010/0206071 A1* | 8/2010 | Rocznik | ............... | G01C 19/574 73/504.12 |
| 2010/0242600 A1* | 9/2010 | Lin | ....................... | B81B 7/0074 73/504.12 |
| 2011/0048133 A1* | 3/2011 | Lin | ......................... | G01P 15/09 73/514.34 |
| 2011/0179868 A1* | 7/2011 | Kaino | ................ | G01C 19/5607 73/504.12 |
| 2011/0296919 A1* | 12/2011 | Reinmuth | ............ | G01P 15/125 73/514.38 |
| 2012/0059620 A1* | 3/2012 | Lee | ......................... | G01H 1/00 702/141 |
| 2012/0180568 A1* | 7/2012 | Koyama | ................. | G01P 1/023 73/579 |
| 2012/0216616 A1* | 8/2012 | Schultz | ................. | G01P 15/125 73/514.38 |
| 2013/0068019 A1* | 3/2013 | Takase | ................... | G01C 19/56 73/504.12 |
| 2013/0068023 A1* | 3/2013 | Cheng | .................. | G01P 15/125 73/514.32 |
| 2013/0180332 A1* | 7/2013 | Jia | ...................... | G01C 19/5762 73/504.12 |
| 2013/0299923 A1* | 11/2013 | Classen | ................. | B81B 3/0018 257/415 |
| 2014/0167188 A1* | 6/2014 | Montez | ................. | B81B 3/0005 257/415 |
| 2014/0217929 A1* | 8/2014 | Lin | ........................ | H02N 1/006 318/116 |
| 2014/0338451 A1* | 11/2014 | Takagi | .................. | G01P 15/125 73/514.32 |
| 2015/0096377 A1* | 4/2015 | Membretti | ............ | G01P 15/125 73/514.32 |

\* cited by examiner

MEMS DEVICE MECHANICAL AMPLITUDE CONTROL

CROSS-REFERENCE TO RELATED APPLICATIONS/INCORPORATION BY REFERENCE

This application is related to U.S. patent application Ser. No. 14/050,201, titled "Elastic Bump Stops for MEMS Devices," and filed on Oct. 9, 2013, the entire contents of which are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Energy consumption is a design constraint for MEMS devices, for example MEMS device implementations having resonant proof masses. For example, MEMS gyroscopes generally rely on relatively high-quality and high-power circuitry, for example amplitude control circuitry, to work properly. The use of lower-power circuitry, however, often leads to reduced performance. Further limitations and disadvantages of conventional and traditional approaches will become apparent to one of skill in the art, through comparison of such approaches with the disclosure as set forth in the remainder of this application with reference to the drawings.

SUMMARY

Figure 1:
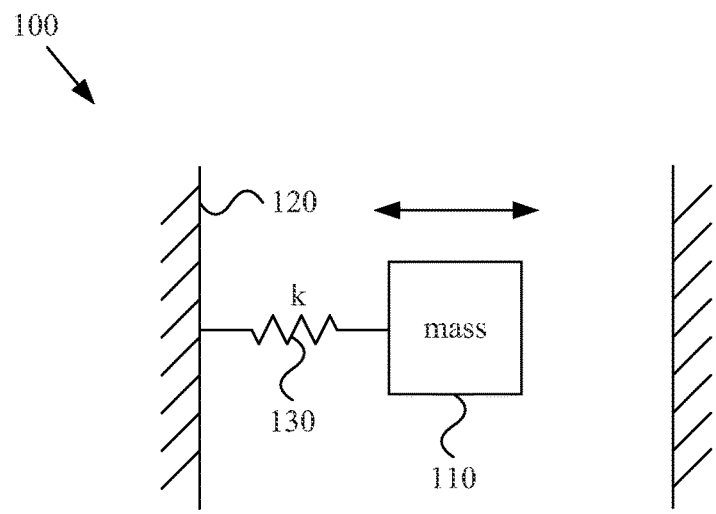
FIG. 1 shows an example block diagram of a MEMS gyroscope proof mass system, in accordance with various aspects of the present disclosure.

Various aspects of this disclosure comprise a system and/or method for utilizing mechanical motion limiters to control proof mass amplitude in MEMS devices (e.g., MEMS devices having resonant MEMS structures, for example various implementations of gyroscopes, magnetometers, accelerometers, etc.). As a non-limiting example, amplitude control for a MEMS gyroscope proof mass may be accomplished during normal (e.g., steady state) gyroscope operation utilizing impact stops (e.g., bump stops) of various designs. As another non-limiting example, amplitude control for a MEMS gyroscope proof mass may be accomplished utilizing non-impact limiters (e.g., springs) of various designs, for example springs exhibiting non-linear stiffness characteristics through at least a portion of their normal range of operation.

DETAILED DESCRIPTION OF VARIOUS ASPECTS OF THE DISCLOSURE

The following discussion presents various aspects of the present disclosure by providing various examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

The following discussion may at times utilize the phrase "A and/or B." Such phrase should be understood to mean just A, or just B, or both A and B. Similarly, the phrase "A, B, and/or C" should be understood to mean just A, just B, just C, A and B, A and C, B and C, or all of A and B and C.

The following discussion may at times utilize the phrases "operable to," "operates to," and the like in discussing functionality performed by particular hardware, including hardware operating in accordance with software instructions. The phrases "operates to," "is operable to," and the like include "operates when enabled to." For example, a module that operates to perform a particular operation, but only after receiving a signal to enable such operation, is included by the phrases "operates to," "is operable to," and the like. Also for example, circuitry is "operable" to perform a function whenever the circuitry comprises the necessary hardware and code (if any is necessary) to perform the function, regardless of whether performance of the function is disabled, or not enabled (e.g., by a user-configurable setting, factory trim, etc.).

The following discussion may at times refer to various system or device functional modules or circuitry (e.g., sensor processing circuitry, proof mass drive control circuitry, etc.). It should be understood that the functional modules or circuitry were selected for illustrative clarity and not necessarily for providing distinctly separate hardware and/or software modules. For example, any one or more of the modules or circuits discussed herein may be implemented by shared hardware, including for example a shared processor. Also for example, any one or more of the modules discussed herein may share software portions, including for example subroutines. Additionally for example, any one or more of the modules discussed herein may be implemented with independent dedicated hardware and/or software. Accordingly, the scope of various aspects of this disclosure should not be limited by arbitrary boundaries between modules and/or circuits unless explicitly claimed. Additionally, it should be understood that when the discussion herein refers to a module or circuit performing a function, the discussion is generally referring to either a pure hardware module implementation and/or a processor operating in accordance with software. Such software may, for example, be stored on a non-transitory machine-readable medium.

In various example implementations discussed herein, a chip is defined to include at least one substrate typically formed from a semiconductor material. A single chip may for example be formed from multiple substrates, where the substrates are mechanically bonded. A multiple chip (or multi-chip) configuration includes at least 2 substrates, wherein the 2 substrates are electrically connected, but do not require mechanical bonding.

A package provides electrical connection between the bond pads on the chip (or for example a multi-chip module) and a metal lead that can be soldered to a printed circuit board (or PCB). A package typically comprises a substrate and a cover. An Integrated Circuit (IC) substrate may refer to a silicon substrate with electrical circuits, typically CMOS circuits. A MEMS substrate provides mechanical support for the MEMS structure(s). The MEMS structural layer is attached to the MEMS substrate. The MEMS substrate is also referred to as handle substrate or handle wafer. In some examples, the handle substrate serves as a cap to the MEMS structure.

In the described examples, an electronic device incorporating a sensor (e.g., one or more of the sensors discussed herein) may, for example, employ a motion tracking module also referred to as Motion Processing Unit (MPU) that includes at least one sensor in addition to electronic circuits. The at least one sensor may comprise any one or more of a variety of sensors, such as for example a gyroscope, a magnetometer (or compass), an accelerometer, a microphone, a pressure sensor, a proximity sensor, a moisture sensor, a temperature sensor, a biometric sensor, or an ambient light sensor, among others known in the art.

Some example system implementations may, for example, comprise an accelerometer, gyroscope, and magnetometer or other compass technology, which each provide a measurement along three axes that are orthogonal relative to each other, and together may be referred to as 9-axis devices. Other example system implementations may, for example, comprise an accelerometer, gyroscope, compass, and pressure sensor, and may be referred to as 10-axis devices. Other embodiments or examples might not include all the sensors or may provide measurements along one or more axes.

The various sensors discussed herein (e.g., a gyroscope) may, for example, be formed on a first substrate. Various embodiments or examples may, for example, include solid-state sensors and/or any other type of sensors. The electronic circuits in the MPU may, for example, receive measurement outputs from the one or more sensors. In various example implementations, the electronic circuits process the sensor data. The electronic circuits may, for example, be implemented on a second silicon substrate. In some example implementations, the first substrate may be vertically stacked, attached and electrically connected to the second substrate in a single semiconductor chip, while in other example implementations, the first substrate may be disposed laterally and electrically connected to the second substrate in a single semiconductor package (e.g., both attached to a common packaging substrate or other material). In other example implementations, the sensors may, for example, be formed on different respective substrates (e.g., all attached to a common packaging substrate or other material).

In an example implementation, the first substrate is attached to the second substrate through wafer bonding, as described in commonly owned U.S. Pat. No. 7,104,129, which is hereby incorporated herein by reference in its entirety, to simultaneously provide electrical connections and hermetically seal the MEMS devices. This fabrication technique advantageously enables technology that allows for the design and manufacture of high performance, multi-axis, inertial sensors in a very small and economical package. Integration at the wafer level minimizes parasitic capacitances, allowing for improved signal-to-noise ratio relative to a discrete solution. Such integration at the wafer level also enables the incorporation of a rich feature set, which minimizes the need for external amplification.

An example of a MEMS sensor utilizing a resonating (or oscillating) proof mass is a MEMS gyroscope sensor. MEMS gyroscope sensors generally comprise one or more proof masses that are oscillated and utilized to measure Coriolis forces. Present gyroscope systems (e.g., MEMS gyroscope systems) include proof mass drive circuitry that tightly controls proof mass oscillation. The circuitry utilized to tightly control proof mass motion amplitude and/or velocity often includes precision amplifier and/or automatic gain control (AGC) circuitry that consumes a relatively large amount of energy. To provide the relatively tight oscillation control needed, the control circuitry is also relatively complex and occupies a significant amount of CMOS area.

At a high level, proof mass drive circuitry generally comprises a feedback loop that senses proof mass drive amplitude, increasing the magnitude of the proof mass drive signal if the amplitude of the proof mass oscillation is too low, and decreasing the magnitude of the proof mass drive signal if the amplitude of the proof mass oscillation is too high.

Turning now to the figures, FIG. 1 shows an example block diagram of a MEMS gyroscope proof mass system 100, in accordance with various aspects of the present disclosure. The proof mass 110 is generally coupled to a stationary reference 120 (e.g., side walls) with a coupling 130 (e.g., one or more beams, springs, and/or other structures). The coupling 130 is characterized in FIG. 1 by a spring with spring coefficient k, which may for example be constant or variable. The coupling 130 produces a restoring force, which acts on the proof mass 110 to return it to a center equilibrium position. The restoring force may, for example, be a function of the spring coefficient k and displacement of the proof mass 110 from the center equilibrium position.

Drive circuitry drives or oscillates the proof mass (e.g., electrostatically) from side to side at a controlled amplitude. While maintaining the proof mass in steady state oscillation, the drive circuitry need only generally overcome the damping. Various circuit configurations may be utilized to drive the proof mass, a non-limiting example of which will now be provided.

Figure 2:
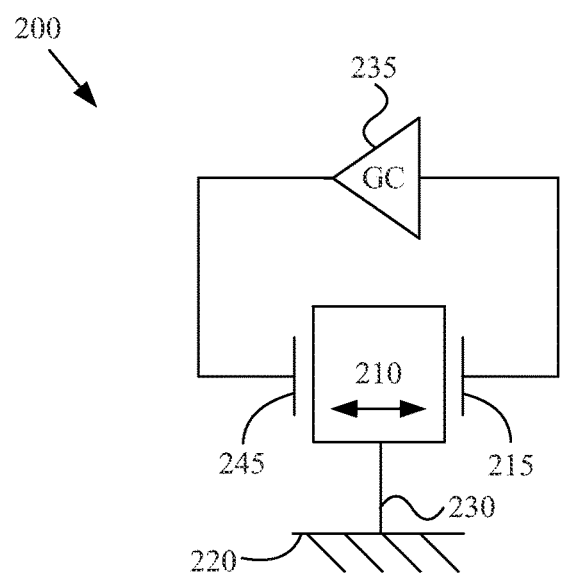
FIG. 2 shows an example schematic diagram of a MEMS gyroscope sensor, in accordance with various aspects of the present disclosure.

FIG. 2 shows an example schematic diagram of various components of a MEMS gyroscope sensor 200, in accordance with various aspects of the present disclosure. As discussed herein, MEMS gyroscope examples are presented and discussed as non-limiting examples of general MEMS sensors with MEMS resonant structures. Accordingly, the scope of this disclosure is not limited to only MEMS gyroscopes.

The sensor 200 comprises a mass 210, which may also be referred to herein as a proof mass, which is driven in a vibratory or oscillatory manner in a drive direction, shown by the double arrow in FIG. 2. The drive circuitry may, for example, comprise a sense electrode 215 (e.g., an electrode of a capacitive sensor or other type of sensor), a feedback amplifier with gain control 230 and a drive electrode 245 (e.g., an electrostatic drive element).

The example proof mass 210 is connected to the substrate 220 (e.g., a stationary reference) by a spring 230. The sense electrode 215 detects the motion of the proof mass 210. The gain control 235 receives the output of the sense electrode 215 and outputs a signal to the drive electrode 245. The gain control 235 adjusts the signal to the drive electrode 245 to set the amplitude of the proof mass 210, which in turn is detected by the sense electrode 215.

Other examples of gyroscope structures and/or circuitry may, for example, be found in commonly owned U.S. Pat. No. 8,833,162, titled "Micromachined Gyroscope Including a Guided Mass System"; and U.S. patent application Ser. No. 14/041,810, titled "Micromachined Gyroscope Including a Guided Mass System, filed Sep. 30, 2013, each of which is hereby incorporated herein by reference in its entirety.

The present disclosure provides various implementation examples in which mechanical features may be utilized for gyroscope amplitude control. In general, such mechanical features may for example enable the utilization of simpler and/or more energy-efficient gyroscope drive circuitry, for example during normal operation of the gyroscope. For example, referring briefly to FIG. 2, such mechanical features may enable the simplification of the gain control 235. The mechanical features may, for example, comprise motion-limiters in any of a variety of configurations, non-limiting examples of which will be provided herein.

Figure 3:
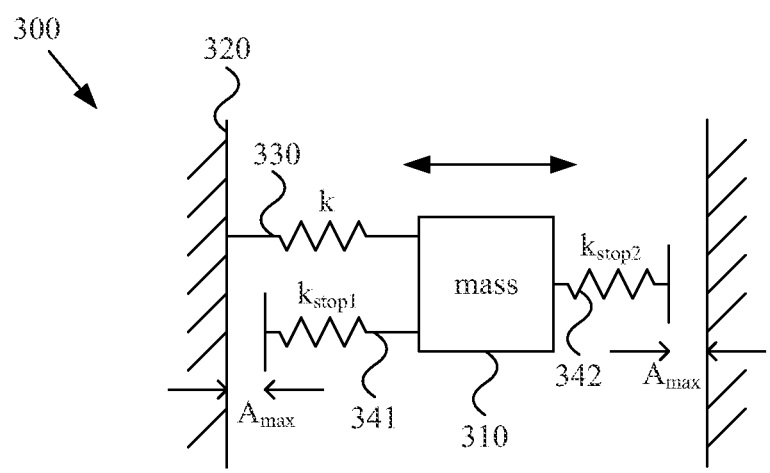
FIG. 3 shows an example block diagram of a MEMS gyroscope proof mass system, in accordance with various aspects of the present disclosure.

FIG. 3 shows an example block diagram of a MEMS gyroscope proof mass system 300, in accordance with various aspects of the present disclosure. The system 300 may, for example, share any or all characteristics with the sensor 200 of FIG. 2. The illustrated proof mass 310 is coupled to the stationary reference 320 (e.g., a side wall) with a coupling 330 (e.g., one or more beams, springs, and/or other structures). The coupling 330 is characterized in FIG. 3 by a spring with spring coefficient k, which may for example be constant or variable. The coupling 330 produces a restoring force, which acts on the proof mass 310 to return the proof mass 310 to a center equilibrium position. The restoring force may, for example, be a function of the spring coefficient k and displacement of the proof mass 310 from the center equilibrium position.

The proof mass system 300 also models a first mechanical motion limiter 341 with a first spring labeled $k_{stop1}$ and a respective first contact, and models a second mechanical motion limiter 342 with a second spring 342 labeled $k_{stop2}$ and a respective second contact. The motion limiters 341 and 342 are illustrated with springs and contacts to convey that at some point (e.g., at or near a desired oscillation amplitude of the proof mass 310) the motion limiters 341 and 342 will limit the travel of the proof mass 310 (e.g., limit the oscillation amplitude). As discussed herein, the motion limiters 341 and 342 may be characterized by any of a wide variety of stopping characteristics, and the spring constants $k_{stop1}$ and $k_{stop2}$ may comprise any of a variety of spring constant characteristics. For example, either or both of the spring constants $k_{stop1}$ and $k_{stop2}$ may be essentially infinite, linear with a value substantially higher than k (e.g., at least 5 times higher, at least one or two orders of magnitude higher, etc.), non-linear with a value that increases as a function of compression and/or extension amount (e.g., a $1^{st}$ order function, a $2^{nd}$ order function, $3^{rd}$ order function, $4^{th}$ order function, $5^{th}$ order function, general n-th order function where n>1, etc.). For example, either or both of the spring constants $k_{stop1}$ and $k_{stop2}$ may be relatively insignificant or zero until the proof mass 310 nears a desired amplitude (e.g., displacement from a central position), at which point they may ramp up quickly, for example in a rapid linear and/or non-linear manner. A graphical curve showing the ramp-up of $k_{stop1}$ and/or $k_{stop2}$ may be smooth (e.g., where the shape of the spring is such that $k_{stop1}$ and/or $k_{stop2}$ is a smooth function of compression) and/or may include discontinuities (e.g., where the proof mass suddenly encounters (or impacts) an additional bump stop or spring).

Figures 4A, 4B:
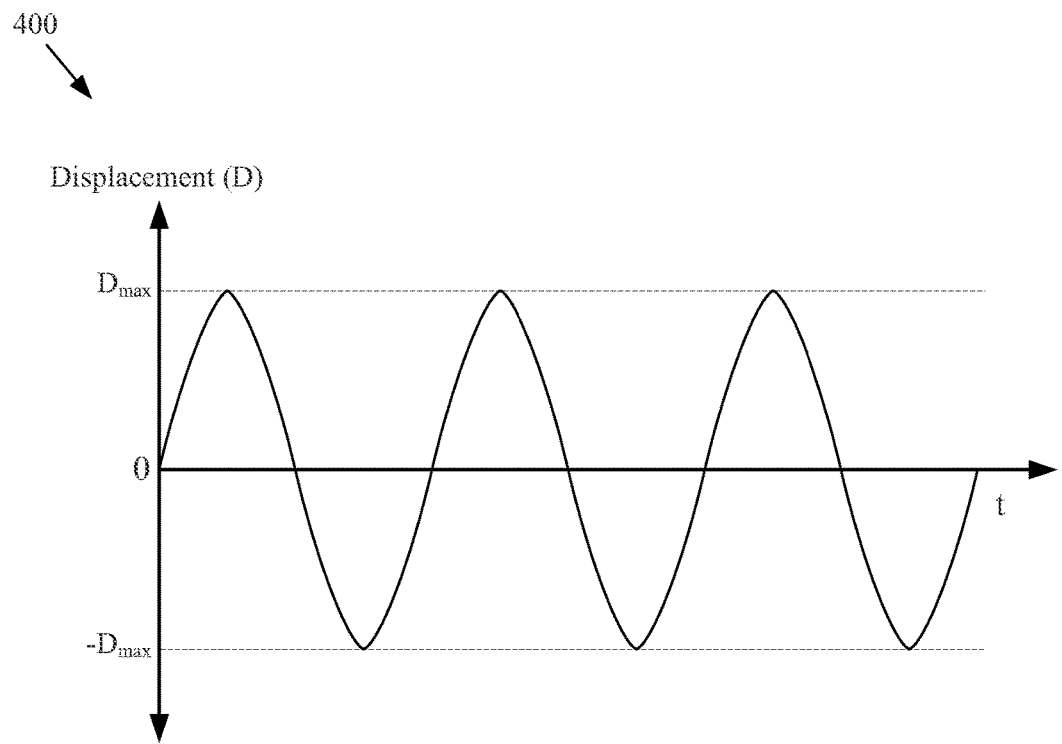
FIG. 4A shows an example motion waveform of a MEMS gyroscope proof mass, in accordance with various aspects of the present disclosure.
FIG. 4B shows an example chart of frequency content of the example motion waveform of FIG. 4A, in accordance with various aspects of the present disclosure.

FIG. 4A shows an example motion waveform 400 of a MEMS gyroscope proof mass, in accordance with various aspects of the present disclosure. The motion waveform 400 may, for example, share any or all characteristics with motion of the proof mass 310 of FIG. 3 and/or of the proof mass 210 of FIG. 2. The motion waveform may, for example, generally comprise characteristics of a sine wave. For example, the motion waveform may, for the most part, be controlled by the restoring spring force provided by coupling members between the proof mass and the stationary reference. The motion waveform may also for example include a sharp peak at the maximum displacement ($D_{max}$ and/or $-D_{max}$) from equilibrium, which may also be referred to herein as the amplitude, where travel of the proof mass is stopped by a mechanical motion limiter. In other words, the motion waveform may comprise a substantial first harmonic component and a substantial third harmonic component, as well as other odd harmonics. The magnitude of the third harmonic component may, for example, be reflective of the extent to which the motion limiter limits the peak travel of the proof mass. Similarly, higher-order harmonics (e.g., the fifth harmonic, etc.) may also be reflective of the extent to which the motion limiter limits the peak travel of the proof mass. In various other implementations of a mechanical motion limiter, the motion waveform may, for example, include peaks that are flattened at maximum displacement, at least for a short duration.

FIG. 4B shows an example chart 450 of a portion of the frequency content of the example motion waveform 400 of FIG. 4A, in accordance with various aspects of the present disclosure. As shown in the chart 450, the waveform includes a substantial third harmonic component. For example a sharper peak in the waveform 400 may correspond to a substantial additive third harmonic component, and a flatter top in the waveform 400 may correspond to a substantial subtractive third harmonic component. In either case, a substantial third harmonic component exists, caused at least in part by the mechanical motion limiter. Note that the relative magnitudes of the illustrated first and third harmonic components were selected for illustrative convenience.

Since the third harmonic component is reflective of the extent to which the motion limiter limits the peak travel of the proof mass, the third harmonic may be utilized for controlling the proof mass drive circuitry. For example, a minimum threshold magnitude 461 for the third harmonic may be specified to ensure that the proof mass is being motion limited by the motion-limiting features discussed herein, and thus operating at or close enough to the desired amplitude. Also for example, a maximum threshold magnitude 462 for the third harmonic may be specified to ensure that the proof mass is not being driven too hard, which may cause chipping, fracturing, general material wear, etc. A drive control circuit, for example as illustrated in FIG. 2 (e.g., the gain control 230), may then be operable to drive the proof mass to a steady state with the third harmonic operating between the maximum threshold 462 and the minimum threshold 461 (e.g., at a target midpoint between the minimum threshold 461 and the maximum threshold 462). Any of a variety of control loops may be utilized to maintain operation at or near the targeted operation (e.g., a PID control loop). Note that other harmonics may also be utilized (e.g., in additional to or instead of the third harmonic) without departing from the scope of this disclosure.

The proof mass drive circuitry may be simplified relative to typical proof mass drive circuitry. For example, since the maximum displacement (or amplitude) of the proof mass travel is mechanically controlled by the motion limiter, the proof mass drive circuitry need only drive the proof mass at least enough to cause the motion limiter to act on the proof mass. Though a substantial amount of overdrive should be avoided, there is a relatively large margin for drive error, resulting in relatively looser amplitude control requirements compared to various prior systems. For example, because of the motion limiters, extra drive energy will not significantly increase the proof mass amplitude, and a shortfall of drive energy will not significantly decrease the proof mass amplitude. Accordingly, circuitry to provide such proof mass amplitude control may, for example, be substantially simpler and more energy efficient than typical proof mass drive circuitry.

In another example in which the gain control circuit operates on the third harmonic or only on the third harmonic, which may have less amplitude than the first harmonic, the gain control circuit may achieve a similar accuracy of control with a lower signal-to-noise ratio and consequently lower power consumption.

In another example, an open loop drive control may be utilized by providing drive energy that has been determined (e.g., empirically) to oscillate the proof mass to at least the desired amplitude, to at least the desired amplitude plus a safety margin (e.g., a percentage greater than zero, such as +5%, +10%, etc.) to compensate for process and/or environmental variations, etc. For example, a proof mass may be experimentally driven (e.g., during production, in a development lab, etc.), and a drive voltage may be identified that reliably drives the proof mass to be amplitude-limited by the mechanical motion limiter. The identified drive voltage may, for example, be set at design time, determined and configured at the factory, etc. Identifying a drive voltage may, for example, be performed utilizing harmonic analysis, such as that discussed herein with regard to FIG. 4. Note that such a drive voltage may also be determined when a MEMS sensor is turned on and/or powered up.

In a further example, a device utilizing the MEMS sensor (e.g., a MEMS gyroscope sensor) may perform scheduled tests (e.g., weekly, monthly, based on amount of tracked usage, based on a detected ambient temperature variation, etc.) to set or adjust the drive voltage. In an example scenario, when a consumer electronic device that incorporates the MEMS sensor is plugged into a wall outlet, the device may determine to calibrate the proof mass drive voltage, drive the proof mass with a voltage that increases until the third harmonic magnitude of the sensed proof mass drive motion is determined to reach a threshold level, and program the voltage level into memory.

In an additional example, the relationship between environmental factors (e.g., temperature) and the necessary drive voltage may be determined empirically, and a table of temperature ranges and respective drive voltages may be programmed into the device. In such an example, a device utilizing the MEMS sensor may measure the temperature and identify the drive voltage based on the temperature.

Figure 4C:
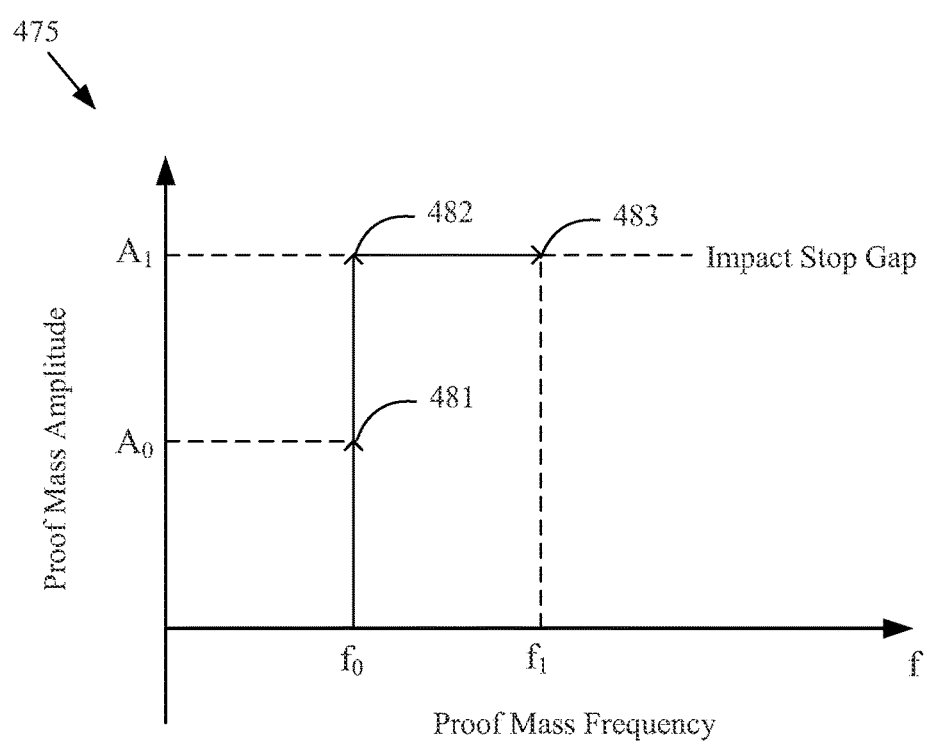
FIG. 4C illustrates an example method for calibrating the drive force of a MEMS sensor, in accordance with various aspects of the present disclosure.

FIG. 4C illustrates another example method for calibrating the drive force of a MEMS sensor, in accordance with various aspects of the present disclosure. At operating point 481, the proof mass is driven at an oscillation amplitude $A_0$ less than the impact stop gap $A_1$ and will oscillate at the natural frequency of the device $f_0$. As the drive force is increased and just prior to operating point 482, the proof mass is driven at an oscillation amplitude slightly less than the impact stop gap $A_1$ and will still oscillate at the natural frequency of the device $f_0$. At a drive force that causes the proof mass to contact the impact stop, the oscillation amplitude will be limited to the impact stop gap $A_1$ and the oscillation frequency will change to a new oscillation frequency $f_1$. Such operation is shown in FIG. 4C at operating point 483. Since the impact stop limits the oscillation amplitude, the increase in drive force results in a change to the oscillation frequency from $f_0$ to $f_1$.

To calibrate the sensor, the drive force can be varied and the oscillation frequency of the proof mass can be measured. To determine if the proof mass is contacting the impact stop, the drive amplitude can be swept (e.g., up and/or down) and the oscillation frequency can be measured. The drive amplitude may, for example, be set based on the transition point 482 where the oscillation frequency begins to change. For example, depending on a desired manner of operation, the drive amplitude may be set to oscillate the proof mass an amplitude just less than $A_1$, the drive amplitude may be set just high enough to cause the proof mass to contact the impact stop, the drive amplitude may be set high enough to ensure consistent contact of the proof mass with the impact stop, etc. As with other methods of sensor calibration discussed herein, this calibration technique may be utilized for calibration during production of the sensor, during production of a device incorporating the sensor, when a sensor is turned on or powered up, when an application of a device incorporating a sensor decides to utilize the sensor or anticipates utilization of the sensor, upon receiving a user command to calibrate sensors, etc.

The maximum amplitude of the proof mass motion may be limited in any of a variety of manners, non-limiting examples of which will now be presented. Two example categories of mechanical motion limiters that will be discussed herein comprise impact stops and non-impact limiters. Impact-stop motion limiters (e.g., bump stops, bump stops combined with springs, etc.) are generally motion limiters based on the proof mass impacting another component. The other component may, for example, comprise a side wall. Non-limiting examples of various impact-stop motion limiter implementations will now be presented.

Figure 5A:
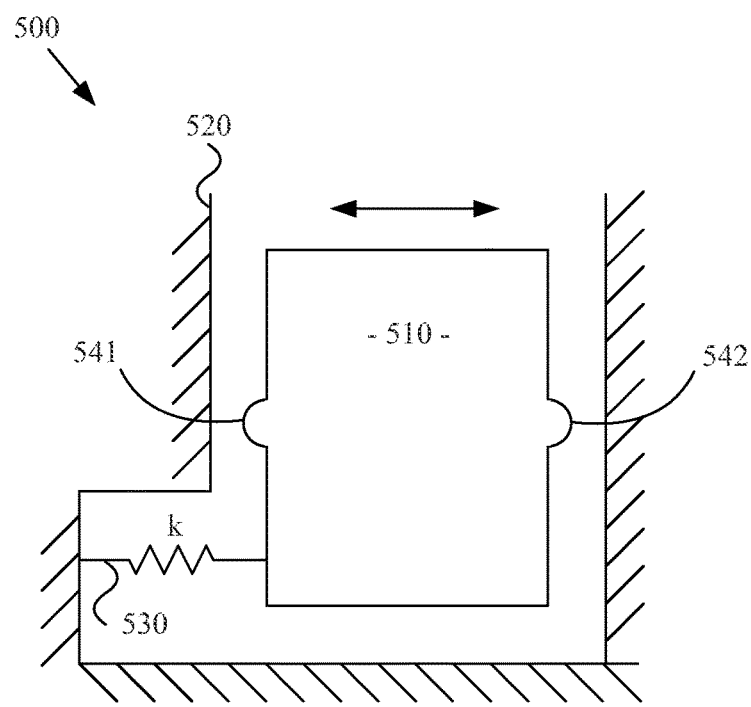
FIG. 5A shows an example block diagram of a MEMS gyroscope proof mass system comprising proof mass bump stops, in accordance with various aspects of the present disclosure.

FIG. 5A shows an example block diagram of a MEMS gyroscope proof mass system 500 comprising proof mass bump stops, in accordance with various aspects of the present disclosure. The example system 500 may share any or all characteristics with the other systems discussed herein.

The proof mass 510 may, for example, be coupled to the stationary reference 520 or component (e.g., a sidewall) with a coupling 530 (e.g., one or more beams, springs, and/or other structures). The coupling 530 is characterized in FIG. 5 by a spring with spring coefficient k, which may for example be constant or variable. The coupling 530 produces a restoring force, which acts on the proof mass 510 to return the proof mass 510 to a center equilibrium position. The restoring force may, for example, be a function of the spring coefficient k and displacement of the proof mass 510 from the center equilibrium position.

The proof mass 510 may, for example, comprise bump stops 541 and 542 protruding from the proof mass 510. The bump stops 541 and 542 may generally serve as points of contact between the proof mass 510 and the sidewall 520 (or stator), for example during steady-state (or normal) operation of the gyroscope (e.g., not just during special operational modes, like testing modes, empirical characterization modes, calibration modes, failure modes, drops, etc.). The bump stops 541 and 542 may, for example, share any or all characteristics with the motion limiters 341 and 342 illustrated in FIG. 3 and discussed herein.

Though the bump stops 541 and 542 are shown with a semi-circular shape, they may be shaped in any of a variety of manners. For example, the bump stops 541 and 542 may be rounded (e.g., semi-circular, semi-elliptical, etc.). Also for example, the bump stops 541 and 542 may be flat (e.g., with contact surfaces parallel with the edge of the proof mass 510 on which they are located, with contact surfaces parallel to the sidewall 520 when contacting the sidewall 520, etc.).

Though the bump stops 541 and 542 are shown at a center point in the proof mass 510, the bump stops 541 and 542 may be positioned at any location around the proof mass 510. Additionally, though only one bump stop 541 and 542 is illustrated on each contacting side of the proof mass 510, a plurality of bump stops 541 and 542 may be positioned on each contacting side of the proof mass.

The bump stops 541 and 542 or respective portions thereof may, for example, be formed integrally with the proof mass 510 (e.g., formed from silicon while the proof mass 510 is being formed). Also for example, the bump stops or a portion thereof may comprise material that is deposited on the proof mass 510 after formation of the proof mass 510.

Though the bump stops 541 and 542 may have at least some compliance due to the material from which they are formed (e.g., entirely formed from a compliant material, comprising a compliant coating, self-adhesive monolayer [SAM] coating, etc.), additional compliance may be designed into the bump stops, for example to conserve energy (e.g., during the collision). Such additional compliance may also, for example, lessen impact forces and potentially reduce chipping, fracturing, or other damage to the MEMS structure. Other mechanical aspects may be incorporated into bump stops and/or areas contacted by bump stops, for example scallops, to reduce chipping or other structural damage to the bump stops or material impacted by the bump stops.

Figure 5B:
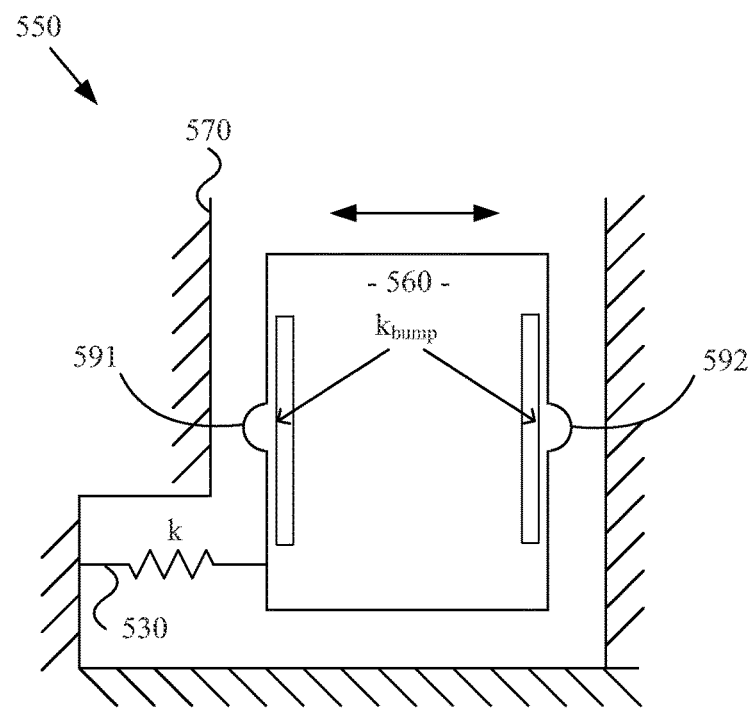
FIG. 5B shows an example block diagram of a MEMS gyroscope proof mass system comprising proof mass compliant bump stops, in accordance with various aspects of the present disclosure.

FIG. 5B shows an example block diagram of a MEMS gyroscope proof mass system 550 comprising proof mass compliant bump stops, in accordance with various aspects of the present disclosure.

In comparison to the proof mass bump stops illustrated in FIG. 5A, the bump stops 591 and 592 of FIG. 5B comprise compliance-enhancing features (e.g., spring features like flexible beams or other spring structures) that soften the impact between the proof mass 560 and the sidewall 570. Although only one configuration of the compliance-enhancing feature is illustrated, it will be understood that any of a variety of spring configurations may be utilized (e.g., folded spring structures, leaf spring structures, any of the spring structures discussed herein, etc.).

In addition to, or instead of, incorporating bump stops into the proof mass, bump stops may be formed on the stationary reference (e.g., side walls) to be impacted by the proof mass during normal operation of the MEMS gyroscope.

Figure 6A:
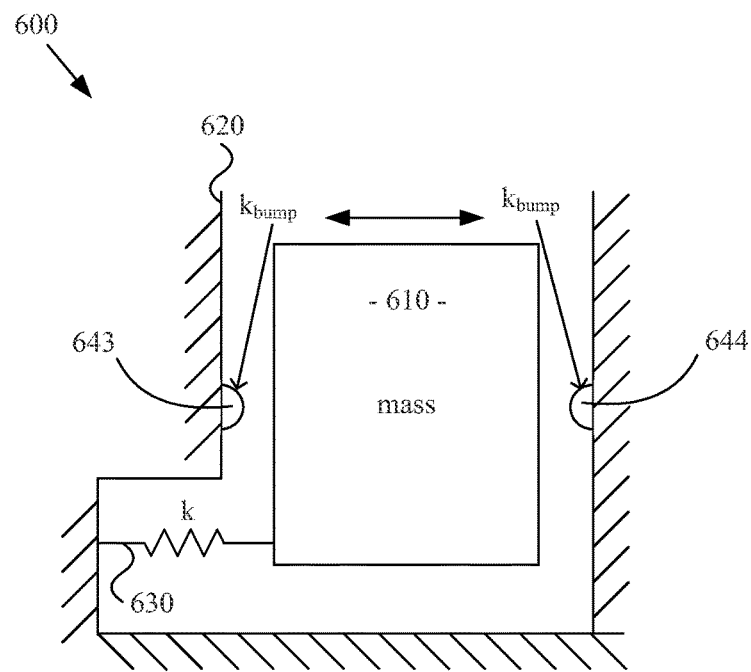
FIG. 6A shows an example block diagram of a MEMS gyroscope proof mass system comprising sidewall bump stops, in accordance with various aspects of the present disclosure.

FIG. 6A shows an example block diagram of a MEMS gyroscope proof mass system 600 comprising sidewall bump stops, in accordance with various aspects of the present disclosure. The example system 600 may share any or all characteristics with the other systems discussed herein.

The proof mass 610 may, for example, be coupled to the stationary reference 620 or component (e.g., a sidewall) with a coupling 630 (e.g., one or more beams, springs, and/or other structures). The coupling 630 is characterized in FIG. 6 by a spring with spring coefficient k, which may for example be constant or variable. The coupling 630 produces a restoring force, which acts on the proof mass 610 to return the proof mass 610 to a center equilibrium position. The restoring force may, for example, be a function of the spring coefficient k and displacement of the proof mass 610 from the center equilibrium position.

The system 600 may, for example, comprise bump stops 643 and 644 protruding from the sidewalls 620 (e.g., relatively stationary surfaces between which the proof mass 610 is oscillating). The bump stops 643 and 644 serve as points of contact between the proof mass 610 and the sidewall 620 (or stator), for example during steady-state (or normal) operation of the gyroscope (e.g., not just during special operational modes, like testing modes, empirical characterization modes, calibration modes, failure modes, drops, etc.). The bump stops 643 and 644 may, for example, share any or all characteristics with the motion limiters 341 and 342 illustrated in FIG. 3 and discussed herein. The bump stops 643 and 644 may also, for example, share any or all characteristics with the bump stops 541 and 542 illustrated in FIG. 5 and discussed herein.

Though the bump stops 643 and 644 are shown with a semi-circular shape, they may be shaped in any of a variety of manners. For example, the bump stops 643 and 644 may be rounded (e.g., semi-circular, semi-elliptical, etc.). Also for example, the bump stops 643 and 644 may be flat (e.g., with contact surfaces parallel with the edge of the sidewall 620 on which they are located, with contact surfaces parallel to the proof mass 610 when contacting the sidewall 620, etc.).

Though the bump stops 643 and 644 are shown on the sidewall 620 generally aligned with the center point of the proof mass 610, the bump stops 643 and 644 may be positioned at any location on the sidewalls 620 that will contact the proof mass 610. Additionally, though only one bump stop 643 and 644 is illustrated corresponding to each contacting side of the proof mass 643, a plurality of bump stops 643 and 644 may be positioned on the sidewalls 620. Further, in a configuration in which the sidewalls 620 and the proof mass 610 both have bump stops, the bump stops may be positioned reciprocally so that they contact each other. Alternatively, in a configuration in which both the sidewalls 620 and the proof mass 610 have bump stops, the bump stops may be positioned alternately (e.g., so that they do not contact each other). In a further configuration, bump stops may be entirely eliminated.

The bump stops 643 and 644 or respective portions thereof may, for example, be formed integrally with the sidewalls 620 (e.g., formed from silicon while the sidewalls 620 are being formed). Also for example, the bump stops 643 and 644 or a portion thereof may comprise material that is deposited on the sidewalls 643 and 644 after formation of the sidewalls 643 and 644.

Though the bump stops 643 and 644 may have at least some compliance due to the material from which they are formed (e.g., entirely formed from a compliant material, comprising a compliant coating, SAM coating, etc.), additional compliance may be designed into the bump stops, for example to conserve energy (e.g., during the collision). Such additional compliance may also, for example, lessen impact forces and potentially reduce chipping, fracturing, or other damage to the MEMS structure. Other mechanical aspects may be incorporated into bump stops and/or areas that contact the bump stops, for example scallops, to reduce chipping or other structural damage to the bump stops or material that contacts the bump stops.

Figure 6B:
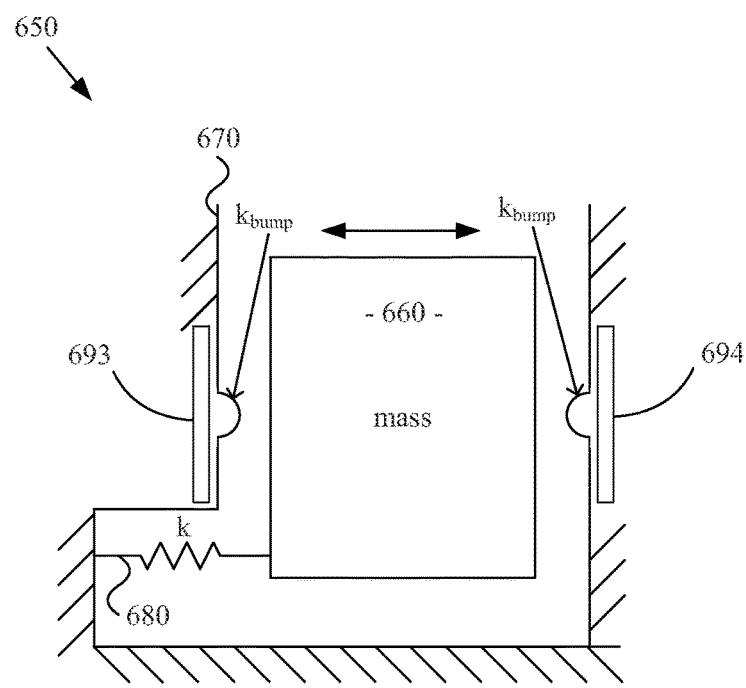
FIG. 6B shows an example block diagram of a MEMS gyroscope proof mass system comprising sidewall compliant bump stops, in accordance with various aspects of the present disclosure.

FIG. 6B shows an example block diagram of a MEMS gyroscope proof mass system 650 comprising sidewall compliant bump stops, in accordance with various aspects of the present disclosure.

In comparison to the sidewall bump stops illustrated in FIG. 6A, the bump stops 693 and 694 of FIG. 6B comprise compliance-enhancing features (e.g., spring features like flexible beams or other spring structures) that soften the impact between the proof mass 660 and the sidewall 670. Although only one configuration of the compliance-enhancing feature is illustrated, it will be understood that any of a variety of spring configurations may be utilized (e.g., folded spring structures, leaf spring structures, any of the spring structures discussed herein, etc.).

The discussion herein provides various examples of impact-stop solutions (e.g., bump stops) in which the proof mass may encounter the stopping force at or near the limits of the desired motion, and otherwise remain generally free of the motion-limiting forces provided by the stop. The utilization of such impact-stop solutions may, for example, result in a sharp discontinuity in the force curve applied to the proof mass. Such sharp discontinuities (e.g., a step change in velocity) may, for example, result in chipping, fracturing, or other wear and tear on the mechanical components of the MEMS gyroscope.

Various other aspects of the present disclosure comprise the utilization of non-impact limiters, for example comprising non-linear spring implementations. Such non-linear spring implementations may, for example, provide for a relatively tightly controlled maximum displacement amplitude while avoiding sharp discontinuities in the force curve. Note that any or all characteristics of the impact-stop and/or non-impact limiter examples discussed herein may be combined in a single implementation, for example an implementation combining both impact-stop and non-impact limiter components.

Figure 7A:
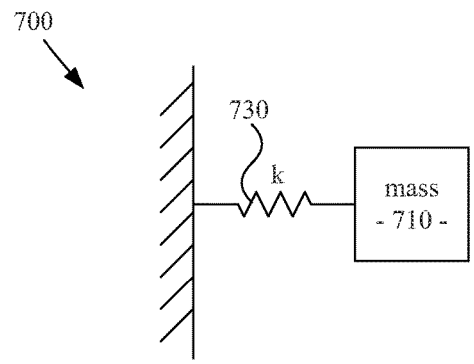
FIG. 7A shows an example block diagram of a MEMS proof mass system, in accordance with various aspects of the present disclosure.
Figure 7B:
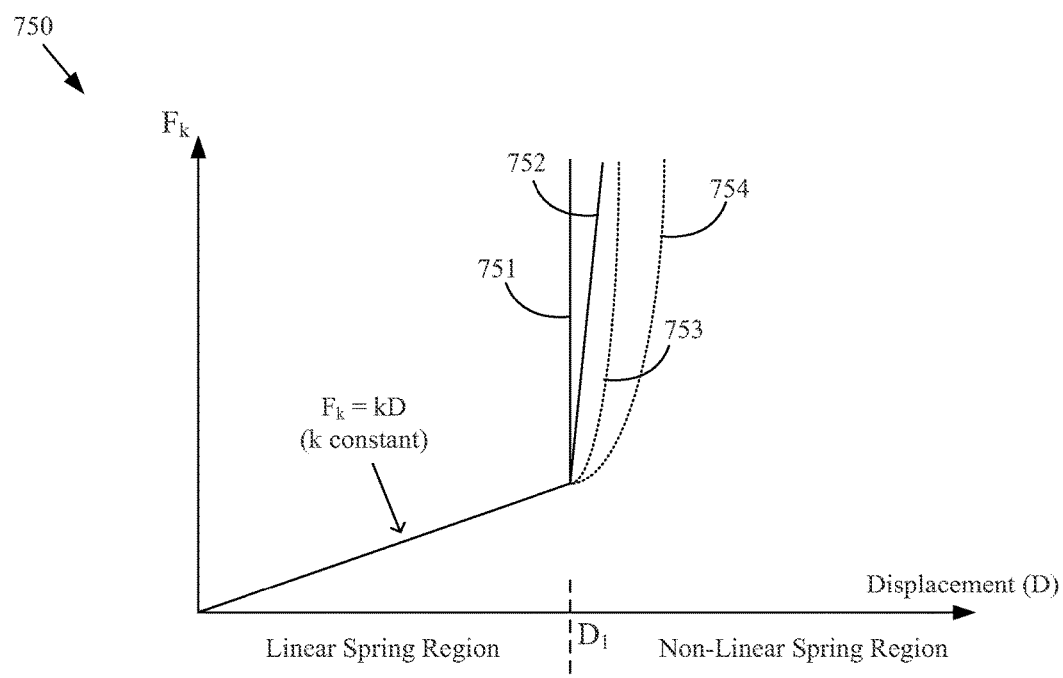
FIG. 7B shows a diagram of spring force versus displacement for various example MEMS gyroscope proof mass springs, in accordance with various aspects of the present disclosure.

FIGS. 7A and 7B are provided to graphically illustrate various aspects of the disclosure. FIG. 7A shows an example block diagram of a MEMS proof mass system 700, in accordance with various aspects of the present disclosure. The system 700 may, for example, represent a simplified view of the other systems shown herein. For illustrative clarity, the proof mass system 700 is illustrated with a proof mass 710 and a single spring 730 but the present disclosure is not limited to a single spring.

The restoring force $F_k$ of the spring acting on the proof mass as a function of displacement D is illustrated at FIG. 7B. In particular, FIG. 7B shows a diagram 750 of spring force versus displacement from a center equilibrium position for various example MEMS gyroscope proof mass spring configurations, in accordance with various aspects of the present disclosure.

As shown in FIG. 7B, various implementations may comprise a linear spring region, for example in which a spring operating on the proof mass 710 may have a generally stable spring constant k. In such region, the restoring force acting on the proof mass 710 generally ramps up linearly as a function of displacement. The diagram 750 also shows a non-linear spring region, which may correspond to a region dominated by non-linearity that is incorporated into the spring design. For example, at or near a displacement $D_1$ (e.g., at or near a target amplitude $D_{max}$ for the proof mass oscillation) non-linearity in the spring 730 design may cause a dramatic rise in the restoring force acting on the proof mass 710 to limit its motion to the target amplitude $D_{max}$ (e.g., +/− an acceptable tolerance, for example one somewhere in the range less than or equal to 5%, etc.). A larger tolerance (e.g., 7% or 10%) may also be used.

The diagram 750 shows various example non-linear spring behaviors. The first example 751, which may also for example correspond to the impact-stop implementations discussed herein, ramps virtually immediately to infinity (from a practical perspective) with a sharp discontinuity at displacement $D_1$, which may be at or near the target amplitude $D_{max}$. The second example 752 has a non-linearity at displacement $D_1$, which may be at or near the target amplitude $D_{max}$, between first and second linear regions, which may, for example, correspond to a step change in spring constant. The third example 753 and fourth example 754 may, for example, correspond to spring behavior of higher-than-linear order. For example the third and/or fourth curves may, for example, correspond to spring designs exhibiting $3^{rd}$, $4^{th}$, $5^{th}$, or higher order functions of spring constant as a function of displacement.

In various example implementations, the linear spring region may comprise at least 80% of the range of motion of the proof mass 710, with the remaining range of motion corresponding to the non-linear spring region. Additionally, the linear spring may comprise at least 90% or 95% of the entire range of motion of the proof mass 710.

Various example non-linear spring designs will now be presented. Note that any or all of such springs may be separate from the coupling that couples the proof mass to the relatively stationary component (or stator) of the sensor and/or may be integrally formed with the coupling.

Figure 8:
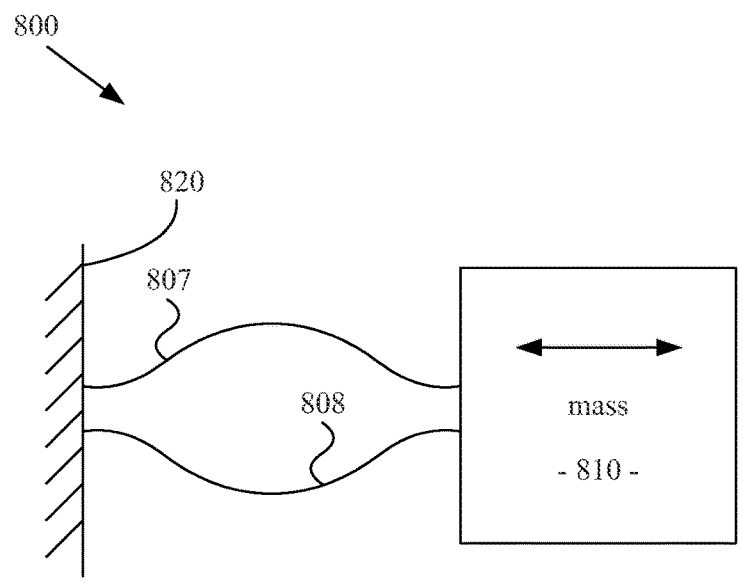
FIG. 8 shows an example block diagram of a MEMS proof mass system comprising spring stops, in accordance with various aspects of the present disclosure.

Turning to FIG. 8, such figure shows an example block diagram of a MEMS proof mass system 800 comprising non-impact limiters (e.g., spring limiters), in accordance with various aspects of the present disclosure. The example system 800 may, for example, share any or all characteristics with the other systems presented herein. The system 800 comprises spring limiters 807 and 808 attached between the proof mass 810 and the stationary reference 820 (e.g., sidewall) in an arc configuration. The spring limiters 807 may, for example, share any or all characteristics with any other springs discussed herein. Though the spring limiters are only illustrated at one side of the proof mass, it should be understood that the spring limiters may be on any or all of the multiple sides of the proof mass (e.g., symmetrically placed on multiple sides of the proof mass).

Figure 9:
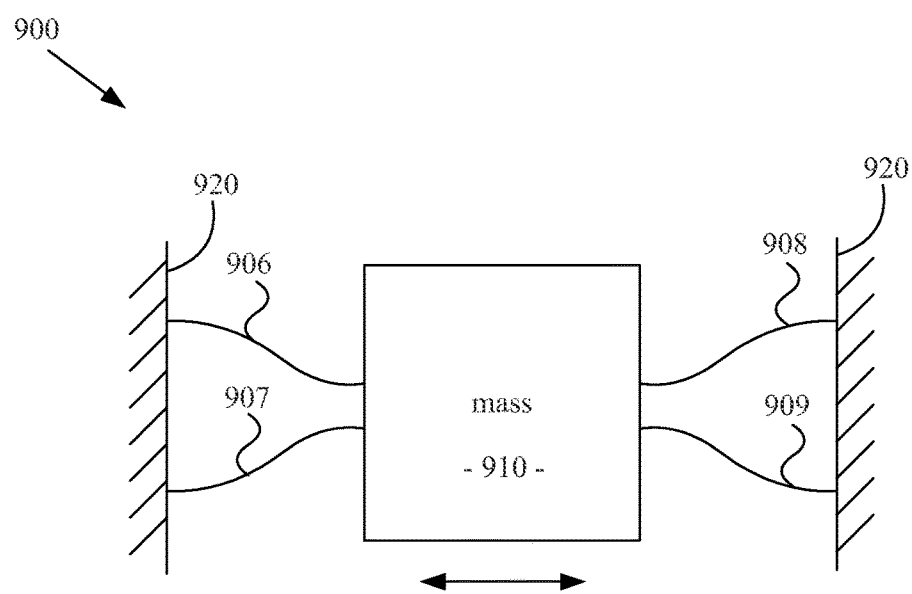
FIG. 9 shows another example block diagram of a MEMS proof mass system comprising spring stops, in accordance with various aspects of the present disclosure.

Turning next to FIG. 9, such figure shows an example block diagram of a MEMS proof mass system 900 comprising non-impact limiters (e.g., spring limiters), in accordance with various aspects of the present disclosure. The example system 900 may, for example, share any or all characteristics with the other systems presented herein. The system 900 comprises spring limiters 906, 907, 908, and 909 attached between the proof mass 910 and the stationary reference 920 (e.g., sidewall) in an S-curve configuration. Though the spring limiters are illustrated at multiple sides of the proof mass 910, it should be understood that the spring limiters may be asymmetrically placed at one or more sides of the proof mass 910.

Figure 10:
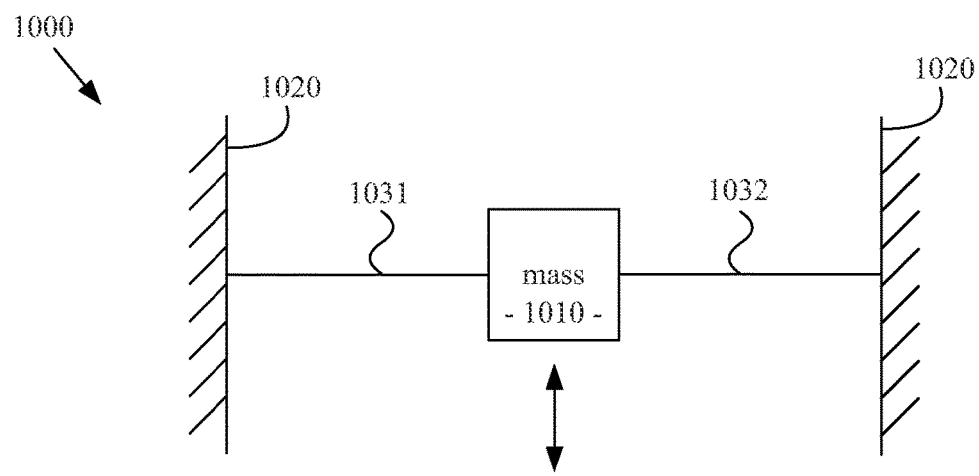
FIG. 10 shows another example block diagram of a MEMS proof mass system comprising spring stops, in accordance with various aspects of the present disclosure.

Turning next to FIG. 10, such figure shows an example block diagram of a MEMS proof mass system 1000 comprising non-impact limiters (e.g., spring limiters), in accordance with various aspects of the present disclosure. The example system 1000 may, for example, share any or all characteristics with the other systems presented herein. The system 1000 comprises spring limiters 1031 and 1032 that are generally configured as straight beams extended between the stationary reference 1020 (e.g., sidewalls) and the proof mass 1010. At low amplitudes, the spring limiters 1031 and 1032 generally behave linearly as a function of bending force of the beams. At higher amplitudes, however, the straight beam spring limiters 1031 and 1032 come under tension and the restoring force acting on the proof mass 1010 becomes non-linear and rapidly increases as a function of displacement from the equilibrium position.

The systems illustrated in FIGS. 1-10, were presented to illustrate various aspects of the disclosure. Any of the systems presented herein may share any or all characteristics with any of the other systems presented herein. Additionally, it should be understood that the various aspects were separated out for the purpose of illustrative clarity, and that the scope of various aspects of this disclosure should not be limited by arbitrary differences between the various examples presented herein. For example, any one or more of the examples may share hardware and/or aspects with any one or more other examples.

A variety of motion limiter architectures have been presented herein by way of example and not limitation. Any of a variety of other motion limiter architectures and/or sensor aspects may also be utilized. Various other examples may be found in U.S. patent application Ser. No. 14/050,201, titled "Elastic Bump Stops for MEMS Devices," and filed on Oct. 9, 2013, the entire contents of which are hereby incorporated herein by reference in their entirety.

As discussed herein, any one or more of the functions (e.g., proof mass drive control functions, sensor processing, etc.) may be implemented by a pure hardware design and/or by a processor (e.g., an application or host processor, a sensor processor, etc.) executing software instructions. Similarly, other examples may comprise or provide a non-transitory computer readable medium and/or storage medium, and/or a non-transitory machine readable medium and/or storage medium, having stored thereon, a machine code and/or a computer program having at least one code section executable by a machine and/or a computer (or processor), thereby causing the machine and/or computer to perform the methods as described herein.

In summary, various aspects of the present disclosure provide a system and method for utilizing mechanical motion limiters to control proof mass amplitude in MEMS devices (e.g., MEMS devices having resonant MEMS structures, for example various implementations of gyroscopes, magnetometers, accelerometers, etc.). While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A MEMS sensor comprising:
a stationary component;
a proof mass that is moveable relative to the stationary component;
a mechanical motion limiter that limits oscillation amplitude of the proof mass; and
a drive circuit that operates to oscillate the proof mass,
wherein during steady state operation of the MEMS sensor, the mechanical motion limiter operates on the proof mass,
wherein the operation of the mechanical motion limiter causes a change in an operating frequency of the proof mass,
and wherein a drive force of the drive circuit is modified based on the change in the operating frequency.

2. The MEMS sensor of claim 1, wherein the MEMS sensor comprises a MEMS gyroscope, and the proof mass is a MEMS gyroscope proof mass.

3. The MEMS sensor of claim 1, wherein the MEMS sensor comprises at least one of: a resonant magnetometer, a mass sensor, a chemical sensor and/or a resonator.

4. The MEMS sensor of claim 1, wherein:
the mechanical motion limiter comprises an impact-stop; and
during steady state operation of the MEMS sensor, the drive circuit drives the proof mass to an oscillation amplitude that causes the proof mass to impact the impact-stop.

5. The MEMS sensor of claim 4, further comprising an anti-stiction coating on the impact-stop.

6. The MEMS sensor of claim 4, wherein:
the impact-stop comprises a protrusion that protrudes from at least one of the stationary component and/or the proof mass.

7. The MEMS sensor of claim 4, wherein the impact-stop comprises a compliant bump stop.

8. The MEMS sensor of claim 7, wherein the compliant bump stop comprises a non-linear spring.

9. The MEMS sensor of claim 1, wherein:
the mechanical motion limiter comprises a non-impact limiter that is connected between the proof mass and the stationary component; and
during steady state operation of the MEMS sensor, the drive circuit drives the proof mass to an oscillation amplitude that causes the non-impact limiter to limit the oscillation amplitude of the proof mass.

10. The MEMS sensor of claim 9, wherein the non-impact limiter comprises a non-linear spring.

11. The MEMS sensor of claim 10, wherein the non-impact limiter comprises a spring system of one or more springs, where the spring system is characterized by a plurality of restoring force functions comprising:
a first restoring force function, in a first region of proof mass displacement from a central position; and
a second restoring force function different from the first restoring force function, in a second region of proof mass displacement from the central position.

12. The MEMS sensor of claim 11, wherein:
the first restoring force function is predominantly a linear function of proof mass displacement; and
the second restoring force function is predominantly a non-linear function of proof mass displacement.

13. A MEMS sensor comprising:
a stationary component;
a proof mass that is moveable relative to the stationary component;
a mechanical motion limiter that limits oscillation amplitude of the proof mass; and
a drive circuit that applies a drive force to the proof mass to cause the proof mass to oscillate at an oscillation frequency;
wherein during steady state operation of the MEMS sensor, the mechanical motion limiter operates on the proof mass to limit a steady state amplitude of the proof mass, and
wherein the magnitude of the drive force is determined, at least in part, by determining that the magnitude of an $N^{th}$ harmonic of the oscillation frequency changes by at least a threshold, where N>1.

14. The MEMS sensor circuit of claim 13, wherein N=3.

15. The MEMS sensor of claim 13, wherein:
the mechanical motion limiter comprises an impact-stop; and
during steady state operation of the MEMS sensor, the drive circuit drives the proof mass to an oscillation amplitude that causes the impact-stop to limit the steady state amplitude.

16. The MEMS sensor of claim 13, wherein:
the mechanical motion limiter comprises a non-impact limiter that is continually in contact with the proof mass; and
during steady state operation of the MEMS sensor, the drive circuit drives the proof mass to an oscillation amplitude that causes the non-impact limiter to limit the oscillation amplitude of the proof mass.

17. A method of calibrating a MEMS sensor comprising, the method comprising:
operating a drive circuit to apply a drive force to a proof mass, wherein the drive force drives the proof mass into an oscillation in which the proof mass contacts a mechanical motion limiter and oscillates at an oscillation frequency;
analyzing the magnitude of an $N^{th}$ harmonic of the oscillation frequency, where N>1, wherein said analyzing comprises determining at least one operating parameter based, at least in part, on a transition of the magnitude of the Nth harmonic past a threshold; and
setting a magnitude of the drive force based, at least in part, on said analyzing.

18. The method of claim 17, wherein N=3.

19. The method of claim 17, wherein said operating, analyzing, and setting are performed upon turning on the MEMS sensor.

20. The method of claim 17, wherein said operating, analyzing, and setting are performed during production of the MEMS sensor.

21. The method of claim 17, wherein said analyzing comprises analyzing a functional relationship between drive force applied to the proof mass and the magnitude of the $N^{th}$ harmonic.

22. A MEMS sensor comprising:
a stationary component;
a proof mass that is moveable relative to the stationary component;
a mechanical motion limiter that limits oscillation amplitude of the proof mass; and
a drive circuit that applies a drive force to the proof mass to cause the proof mass to oscillate at an oscillation frequency;
wherein during steady state operation of the MEMS sensor, the mechanical motion limiter operates on the proof mass to limit a steady state amplitude of the proof mass, and
wherein the magnitude of the drive force is determined by transition of the oscillation frequency away from the natural frequency of the proof mass.

23. The MEMS sensor of claim 22, wherein the mechanical motion limiter comprises an impact-stop.

24. The MEMS sensor of claim 22, wherein the mechanical motion limiter comprises a non-impact limiter that is continually in contact with the proof mass.

* * * * *